(12) United States Patent
Park et al.

(10) Patent No.: US 9,273,388 B2
(45) Date of Patent: Mar. 1, 2016

(54) HARD FILM FOR CUTTING TOOL

(71) Applicant: KORLOY INC., Seoul (KR)

(72) Inventors: Je-Hun Park, Cheongju-si (KR);
Jae-Hoon Kang, Cheongju-si (KR);
Seung-Su Ahn, Cheongju-si (KR);
Sung-Hyun Kim, Cheongju-si (KR);
Sung-Gu Lee, Cheongju-si (KR);
Jung-Wook Kim, Cheongju-si (KR);
Sun-Yong Ahn, Cheongju-si (KR);
Dong-Bok Park, Cheongju-si (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 14/398,125

(22) PCT Filed: Mar. 18, 2013

(86) PCT No.: PCT/KR2013/002168
§ 371 (c)(1),
(2) Date: Oct. 31, 2014

(87) PCT Pub. No.: WO2013/165090
PCT Pub. Date: Nov. 7, 2013

(65) Prior Publication Data
US 2015/0125677 A1    May 7, 2015

(30) Foreign Application Priority Data
May 2, 2012    (KR) .................. 10-2012-0046529

(51) Int. Cl.
*C23C 14/06*    (2006.01)
*B32B 15/01*    (2006.01)

(52) U.S. Cl.
CPC ............. *C23C 14/0641* (2013.01); *B32B 15/01* (2013.01); *Y10T 428/24975* (2015.01)

(58) Field of Classification Search
USPC ............ 51/307, 309; 428/216, 336, 697, 698, 428/699
See application file for complete search history.

(56) References Cited

U.S. PATENT DOCUMENTS

| 7,923,130 B2 * | 4/2011 | Shibata ............... C23C 14/0641 428/216 |
| 2011/0111197 A1 | 5/2011 | Johansson et al. |
| 2011/0183131 A1 | 7/2011 | Maeda et al. |

FOREIGN PATENT DOCUMENTS

| JP | 2009-061520 A | 3/2009 |
| JP | 2012-035378 A | 2/2012 |
| KR | 10-2010-0051642 A | 5/2010 |
| KR | 10-2011-0105980 A | 9/2011 |

* cited by examiner

*Primary Examiner* — Archene Turner
(74) *Attorney, Agent, or Firm* — Revolution IP, PLLC

(57) ABSTRACT

Provided is a hard film for a cutting tool formed on a surface of a base material, the hard film being comprised of a nano multi-layered structure comprising a thin layer A, a thin layer B, a thin layer C and a thin layer D or a structure in which the nano multi-layered structure is repeatedly stacked at least twice, wherein the thin layer A is comprised of $Ti_{1-x}Al_xN$ ($0.5 \leq x \leq 0.7$); the thin layer B is comprised of $Al_{1-y-z}Ti_yCr_zN$ ($0.3 \leq y \leq 0.6$ and $0 < z \leq 0.3$); the thin layer B is comprised of MeN (where Me is Nb or V); and the thin layer D is comprised of $Al_{1-a-b}Ti_aSi_bN$ ($0.3 \leq a \leq 0.7$ and $0 < b < 0.1$).

10 Claims, 1 Drawing Sheet

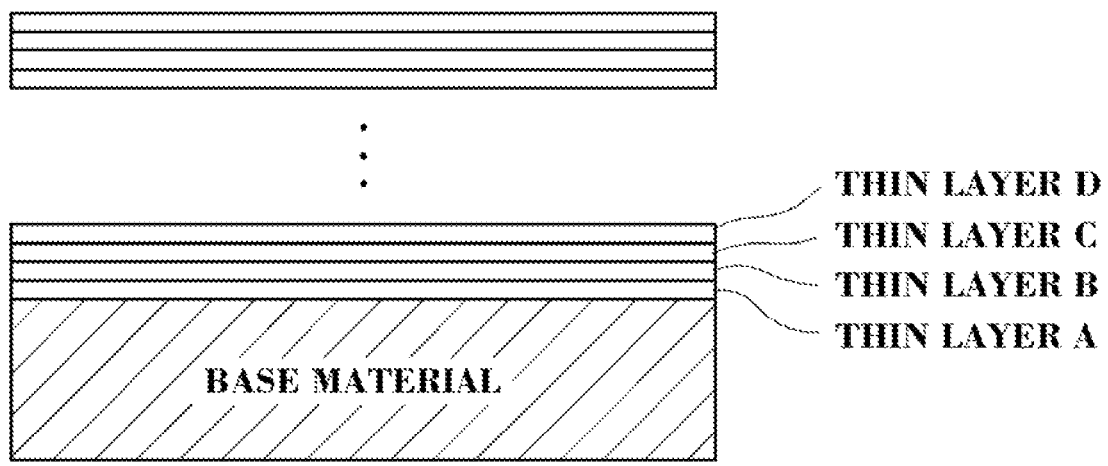

HARD FILM FOR CUTTING TOOL

CROSS REFERENCE TO PRIOR APPLICATIONS

This application is a National Stage Application of PCT International Patent Application No. PCT/KR2013/002168 filed on Mar. 18, 2013, under 35 U.S.C. §371, which claims priority to Korean Patent Application No. 10-2012-0046529 filed on May 2, 2012, which are all hereby incorporated by reference in their entirety.

TECHNICAL FIELD

The present invention relates to a hard film formed on a hard base material such as a hard metal, a cermet, a high-speed steel, an end mill, a drill, a cNB or the like that is used in a cutting tool, and more particularly, to a hard film for a cutting tool configured with a nano multi-layered structure including a thin layer A, a thin layer B, a thin layer C and a thin layer D or with a repeatedly stacked structure thereof, thus improving all of abrasion resistance, lubrication, toughness and oxidation resistance compared to an existing multi-layered thin film structure.

BACKGROUND ART

As the industry gradually advances toward fineness, speedup and mass production, it is required to improve cutting performance and life cycle of a cutting tool. Especially, since high heat of 900° C. or more is locally generated on a front end of the cutting tool rubbing with a workpiece in a rapid cutting of a workpiece having a high hardness and a cutting of a difficult-to-cut material having a low thermal conductivity, life cycle of the cutting tool may be improved by forming a hard film having excellent oxidation resistance and abrasion resistance on a cutting surface of the cutting tool.

In order to improve the cutting performance and life cycle, a single-layered hard film including TiN, $Al_2O_3$, TiAlN, AlTiN, AlCrN or the like having abrasion resistance, oxidation resistance, impact resistance and the like, or a multi-layered hard film in which the single-layered hard films are stacked in two layers or more, is formed on a hard base material such as a hard metal, a cermet, a high speed steel, an end mill, a drill, or the like to cope with demands for the high hardness workpiece and the difficult-to-cut material.

Recently, the hardness of the workpiece is gradually increased, and a demand for processing of a difficult-to-cut material having a low thermal conductivity and severely fused on a tool is also increased. Especially, since stainless steel, heat-resistant alloy steel, ductile cast iron and the like have a low thermal conductance compared to general steels, cutting heat is not emitted due to chips in a cutting and heat is concentrated on a cutting edge portion of the cutting tool, abrasion, seizure and exfoliation phenomena are easily generated on the cutting edge of the cutting tool due to a chemical reaction between the cutting tool and the workpiece, and life cycle of the cutting tool is rapidly reduced.

Therefore, only with the single layered or multi-layered structures having a composition described above, it becomes more and more difficult to cope with a demand for a cutting tool for the cutting of such a difficult-to-be cut material and ductile cast iron, which are required to evenly have characteristics such as excellent abrasion resistance, oxidation resistance and lubrication.

Therefore, trials improving the cutting performance are recently increased through a method for regularly and repeatedly stacking at least two thin films having a nano level that are different in material property.

For example, Korea Patent No. 876366 discloses a thin film structure in which a lower layer is deposited on an insert, an end mill, a drill or a cermet which is a hard metal tool through a physical vapor deposition, in order to improve an adhesion force and align the orientation of crystal grains in the direction of (200) plane, a (Ti,Al)N multi-layered thin film which is a middle layer is continuously deposited in order to improve impact resistance and chipping resistance, and a top layer which is comprised of TiAlN or AlTiSiN, is constituted by layer A, layer B, layer C and layer D and has a structure in which layer A, layer B, layer C and layer D are alternately stacked, is formed to improve the abrasion resistance and oxidation resistance of the top layer.

While the abrasion resistance and oxidation resistance may be improved through the multi-layered structure as described above, development of a hard film having a novel structure is required in order to evenly improve various characteristics such as abrasion resistance, impact resistance (toughness) and chipping resistance required for the cutting.

DISCLOSURE

Technical Problem

The present invention provides a hard film for a cutting tool by which abrasion resistance, lubrication, toughness (impact resistance) and oxidation resistance are generally improved.

Technical Solution

According to an embodiment of the present invention, a hard film for a cutting tool is formed on a surface of a base material, the hard film being comprised of a nano multi-layered structure including a thin layer A, a thin layer B, a thin layer C and a thin layer D or a structure in which the nano multi-layered structure is repeatedly stacked at least twice, wherein the thin layer A is comprised of $Ti_{1-x}Al_xN$ ($0.5 \leq x \leq 0.7$); the thin layer B is comprised of $Al_{1-y-z}Ti_yCr_zN$ ($0.3 \leq y \leq 0.6$ and $0<z \leq 0.3$); the thin layer B is comprised of MeN (where Me is Nb or V); and the thin layer D is comprised of $Al_{1-a-b}Ti_aSi_bN$ ($0.3 \leq a \leq 0.7$ and $0<b<0.1$).

According to another embodiment of the present invention, it is preferable that the nano multi-layered structure be formed by sequentially stacking the thin layer A, the thin layer B, the thin layer C and the thin layer D on the base material.

According to another embodiment of the present invention, it is preferable that each of the thin layer A, the thin layer B, the thin layer C and the thin layer D have an average thickness of 3 nm to 50 nm.

According to another embodiment of the present invention, it is preferable that each of the thin layer A, the thin layer B, the thin layer C and the thin layer D have an average thickness of 20 nm to 40 nm.

According to another embodiment of the present invention, it is preferable that the hard film have an average thickness of 1 μm to 20 μm.

According to another embodiment of the present invention, it is preferable that the hard film have a degradation hardness not less than 35 GPa when degradation-treated at a temperature of 900° C. for 30 minutes.

Advantageous Effects

According to a hard film for a cutting tool of the present invention, since various characteristics required for a hard film for a cutting tool, such as abrasion resistance, lubricant, toughness, chipping resistance, and oxidation resistance, may be evenly improved through a repeated stacking of a nano multi-layered structure formed by sequentially stacking a Ti and Al composite nitride layer commonly having excellent abrasion resistance and an adhesion to a base material, an Al, Ti and Cr composite nitride layer having excellent lubricant, an Nb or V composite nitride layer having excellent toughness and chipping resistance and also having improved lubricant under a high temperature environment, and an Al, Ti and Si composite nitride layer having excellent oxidation resistance, the hard film may be suitably used in processing of a difficult-to-cut material.

That is, in the hard film for the cutting tool of the present invention, thin layers for reinforcing abrasion resistance, lubricant, toughness, and oxidation resistance of each thin layer are periodically and repeatedly stacked to maximize the functions of the respective thin layers, thus capable of harmoniously improving abrasion resistance, lubricant, toughness, and oxidation resistance required for cutting the difficult-to-cut material.

DESCRIPTION OF DRAWINGS

FIG. 1 is a schematic cross-sectional view illustrating a structure of a hard film for a cutting tool according to the present invention.

BEST MODE

Hereinafter, embodiments of the present invention will be described with reference to the accompanying drawings to fully explain the present invention in such a manner that it may easily be carried out by a person with ordinary skill in the art (hereinafter, referred as an ordinary skilled person) to which the present invention pertains. The present invention may, however, be embodied in different forms and should not be construed as limited to the embodiments set forth herein. Also, in the figures, the dimensions of layers and regions are exaggerated for clarity of illustration.

FIG. 1 is a schematic cross-sectional view illustrating a structure of a hard film for a cutting tool according to the present invention. As illustrated in FIG. 1, a thin film for a cutting tool has a structure in which a thin layer A, a thin layer B, a thin layer and a thin layer D are sequentially stacked on a base material to form a nano multi-layered structure, and the nano multi-layered structure is repeatedly stacked twice or more.

The thin layer A is a thin layer aiming to mainly improve abrasion resistance and hardness, and has a composition that is comprised of $Ti_{1-x}Al_xN$ ($0.5 \leq x \leq 0.7$).

In the thin layer A, when an Al content is less than 0.5, since Al having an atomic radius smaller than that of Ti, is substituted, and thus a solid solution amount of Al is decreased, abrasion resistance and hardness of the thin film are reduced, and since $TiO_2$ oxide is easily formed under a high temperature environment in a cutting, a Ti atom in the thin film may be diffused to the outside to incur the high temperature hardness reduction due the depletion of the Ti atom, and when an Al content is more than 0.7, since a phase having a hexagonal B4 structure is formed to reduce abrasion resistance and life cycle of a tool, it is preferable that the Al content be 0.5 or more and 0.7 or less.

The thin layer B is a thin layer aiming to mainly improve lubricant, and has a composition that is comprised of $Al_{1-y-z}Ti_yCr_zN$ ($0.3 \leq y \leq 0.6$ and $0 < z \leq 0.3$).

In the thin layer B, it is preferable that a Ti content be 0.3 or more and 0.6 or less, and the reason is because when a Ti content is less than 0.3, a phase having a hexagonal M4 structure is formed to increase brittleness, to reduce abrasion resistance and to decrease life cycle of a tool, and when a Ti content is more than 0.6, Al having an atomic radius smaller than that of Ti is substituted to decrease the solid solution amount of Ti atom and hardness and abrasion resistance of a thin film, and $TiO_2$ oxide is easily formed under a high temperature environment in a cutting, so a Ti atom in the thin film may be diffused to the outside to incur the high temperature hardness reduction due the depletion of the Ti atom.

Also, the thin layer B contains 0.3 or less of Cr, and when a Cr content is 0.3, lubricant may be remarkably improved. However, when a Cr content is more than 0.3, a coarse thin film structure is formed and concurrently, if the tool is exposed to a high temperature environment in a cutting, segregation of $Cr_2N$ is formed to reduce abrasion resistance and life cycle of the tool. Accordingly, it is preferable that the Cr content be limited to less than 0.3.

The thin layer C is a thin layer aiming to mainly improve toughness and chipping resistance, and is comprised of NbN or Vn basically having high fracture toughness and chipping resistance. Such a thin layer C is phase-changed to $V_2O_5$ or $Nb_2O_5$ in a high temperature work environment so that a lubricant characteristic is improved, and the improvement in lubricant characteristic prevents a film from being exfoliated together with a workpiece to more improve chipping resistance and toughness.

Like this, the thin layer C comprised of NbN or VN forms a multi-layer in a nano level together with a thin film having a different component, and thus allows a hard film for a cutting tool to have evenly and highly balanced characteristics in various terms of toughness, chipping resistance, lubricant and abrasion resistance.

The thin layer D is a thin layer aiming to mainly improve oxidation resistance and hardness, and a detailed composition thereof is comprised of $Al_{1-a-b}Ti_aSi_bN$ ($0.3 \leq a \leq 0.7$ and $0 < b < 0.1$).

In the thin layer D, it is preferable that a Ti content be 0.3 to 0.7, and the reason is that when the Ti content is less than 0.3, a phase having a hexagonal M4 structure is formed to increase brittleness and to reduce abrasion resistance and life cycle, and when the Ti content is more than 0.7, Al having an atomic radius smaller than that of Ti is substituted to reduce the solid solution amount of Ti, thus reducing hardness and abrasion resistance of a thin film, and $TiO_2$ oxide is easily formed under a high temperature environment in a cutting, so that a Ti atom in the thin film may be diffused to the outside to incur the high temperature hardness reduction due the depletion of the Ti atom.

Also, the thin layer D contains less than 0.1 of Si, and the reason is because when Si is added in a small amount (a moderate amount) of 0.1, a non-crystalline $Si_3N_4$ phase is formed along a grain boundary of a crystalline AlTiN phase to refine grains of the crystalline AlTiN phase, so that hardness and abrasion are preferably improved. Also, a non-crystalline $Si_3N_4$ phase forms a $SiO_2$ oxide to play role in preventing outdiffusion of an internal atom into the outside in a high temperature cutting, thus improving the life cycle of the cutting tool.

However, in the thin layer D, when a Si content is more than 0.1, the non-crystalline $Si_3N_4$ phase is increased to reduce hardness, and a grain refinement effect of the crystalline AlTiN phase is lowered to reduce abrasion resistance, so, this is not preferable.

Meanwhile, it is preferable that the thin layer A, the thin layer B, the thin layer C, and the thin layer D have an average thickness of 3 nm to 50 nm.

This is because as the period of a nano multi-layered structure is decreased, occurrence and movement of dislocation are suppressed, and thus a thin film is reinforced, and when the thickness of the thin film is as thin as less more 3 nm, a mixing zone is formed by interdiffusion between two layers to reduce hardness and an elastic modulus while a boundary between the nano multi-layers for suppressing the occurrence and movement of the dislocation becomes unclear, so it is preferable that the thin film be formed in a thickness not less than 3 nm, and when the thickness is more than 50 nm, the occurrence and movement of the dislocation are easier, so that hardness and an elastic modulus are reduced and also coherency strain energy is reduced by formation of misfit dislocation, so that a reinforcement effect reduction phenomenon is accompanied, which is not preferable.

Also, it has been confirmed through an experiment in which only thicknesses of the layers are changed that since an excellent grain boundary reinforcement effect for suppressing movement of dislocation may be obtained through plastic deformation when thicknesses of the thin layer A, the thin layer B, the thin layer C, and the thin layer D are in a range of 20 nm to 40 nm, this thickness range is most preferable.

In preferable Example of the present invention, while the thin layer A, the thin layer B, the thin layer C, and the thin layer D are sequentially stacked so as to form the nano multi-layered structure having the order of A-B-C-D, the realizing method is not limited thereto, and may rather be realized in various types such as A-D-C-B, B-A-D-C, D-A-C-B and the like.

However, when the hard film for the cutting tool according to the present invention is realized in a stack structure in which thin film hardness (and a residual stress) of each layer influencing abrasion resistance and toughness of each thin film is periodically oscillated, since abrasion resistance and toughness representing characteristics relative to each other may be improved at the same time, it is most preferable that the thin film layers be realized in a nano multi-layered structure having the order of A-B-C-D.

Like this, it is most preferable that the thin film for the cutting tool according to the present invention having a nano multi-layered structure or a structure in which the nano multi-layered structure is repeatedly stacked at least twice, have an average thickness of 1 μm to 20 μm.

As described above, the present invention forms a nano multi-layered structure through a combination of a TiAlN, AlTiCrN and AlTiSiN based thin layer and an NbN or VN thin layer, and is characterized in evenly improving abrasion resistance, lubricant, toughness, chipping resistance and oxidation resistance with respect to an entire hard film.

EXAMPLES

In the present invention, a hard film was coated on a surface of a hard base material of WC-10 wt % Co by using an arc ion plating method that is a physical vapor deposition (PVD), the hard base material including a cermet, high speed steel, an end mill, drill or the like. In the coating, a TiAl target, a AlTiCr target, an Nb or V target and an AlTiSi target were used with respect to a thin layer A, a thin layer B, a thin layer C and a thin layer D, respectively. An initial pressure was reduced to $8.5 \times 10^{-5}$ Torr or less, and $N_2$ was introduced as a reaction gas. A gas pressure for coating was 30 mTorr or less and preferably 20 mTorr or less, a coating temperature was 400° C. to 550° C., and a substrate bias voltage was applied in −20 V to −150 V in a coating. Of course, the coating condition may be different from that of Example of the present invention according to an equipment characteristic and condition.

In Example of the present invention, a TiAlN film that is an abrasion resistance layer, an AlTiCr film that is a lubricant layer, an NbN film or a VN film that is a toughness layer, and AlTiSin film that is an oxidation resistance layer were sequentially stacked at an average thickness of 28 nm to 31 nm to form a nano multi-layered structure, and then such a nano multi layered structure was repeatedly formed to manufacture a hard film for a cutting tool having a total thickness of 3.4 μm to 3.6 μm according to Example embodiment of the present invention.

Meanwhile, if necessary, it goes without saying that various types of thin films may be additionally formed on a hard film for a cutting tool formed according to Example of the present invention.

Also, since a hard film for a cutting tool according to Example of the present invention is formed by using a physical vapor deposition (PVD), a thin film thickness may be formed up to 20 μm.

The following Table 1 shows each of a composition, a target composition ratio, a thin film average thickness, a total film thickness and a stack structure with respect to a hard film for a cutting tool according to Example of the present invention.

TABLE 1

| | | Structure of Hard Film | | |
|---|---|---|---|---|
| Example No. | Nano Multi-layered Structure (Target Composition Ratio) | Thin Film Average Thickness (nm) | Total Film Thickness (μm) | Stack Structure |
| 1 | TiAlN(5:5)/ AlTiCrN(54:38:8)/ NbN/AlTiSiN(58:37:5) | 31 | 3.5 | Quinary A/B/C/D Nano Multi-layer |
| 2 | TiAlN(5:5)/ AlTiCrN(54:38:8)/ VN/AlTiSiN(58:37:5) | 30 | 3.4 | Quinary A/B/C/D Nano Multi-layer |
| 3 | TiAlN(5:5)/ AlTiCrN(4:3:3)/ NbN/AlTiSiN(58:37:5) | 30 | 3.6 | Quinary A/B/C/D Nano Multi-layer |
| 4 | TiAlN(5:5)/ AlTiCrN(4:3:3)/ VN/AlTiSiN(58:37:5) | 31 | 3.4 | Quinary A/B/C/D Nano Multi-layer |
| 5 | AlTiN(7:3)/ AlTiCrN(54:38:8)/ NbN/AlTiSiN(58:37:5) | 31 | 3.5 | Quinary A/B/C/D Nano Multi-layer |
| 6 | AlTiN(7:3)/ AlTiCrN(54:38:8)/ VN/AlTiSiN(58:37:5) | 30 | 3.4 | Quinary A/B/C/D Nano Multi-layer |
| 7 | AlTiN(7:3)/ AlTiCrN(4:3:3)/ NbN/AlTiSiN(58:37:5) | 30 | 3.5 | Quinary A/B/C/D Nano Multi-layer |
| 8 | AlTiN(7:3)/ AlTiCrN(4:3:3)/ VN/AlTiSiN(58:37:5) | 28 | 3.4 | Quinary A/B/C/D Nano Multi-layer |

Also, in order to relatively evaluate characteristics of hard films for a cutting tool formed according to Examples of the present invention, hard films having almost the same thickness as Examples of the present invention were formed in thin film structures shown the following Table 2 on a base material of WC-10 wt % Co equal to that of Examples of the present invention.

TABLE 2

Structure of Hard Film

| Comparative Example No. | Nano Multi-layered Structure | Average Thickness of Thin Film (nm) | Total Film Thickness (μm) | Stack Structure |
|---|---|---|---|---|
| 1 | TiAlN(5:5)/AlTiCrN(54:38:8)/TiN | 30 | 3.5 | Ternary A/B/C Nano Multi-Layer |
| 2 | TiAlN(5:5)/AlTiCrN(4:3:3)/TiN | 30 | 3.5 | Ternary A/B/C Nano Multi-Layer |
| 3 | AlTiN(7:3)/AlTiCrN(54:38:8)/TiN | 31 | 3.4 | Ternary A/B/C Nano Multi-Layer |
| 4 | AlTiN(7:3)/AlTiCrN(4:3:3)/TiN | 31 | 3.6 | Ternary A/B/C Nano Multi-Layer |
| 5 | AlTiN(7:3)/AlCrN(7:3)/AlTiSiN(58:37:5) | 30 | 3.6 | Quaternary A/B/C Nano Multi-Layer |
| 6 | TiAlN(5:5)/AlCrN(7:3)/AlTiSiN(58:37:5) | 31 | 3.7 | Quaternary A/B/C Nano Multi-Layer |
| 7 | AlTiN(7:3)/AlTiCrN(54:38:8)/AlTiSiN(58:37:5) | 31 | 3.8 | Quaternary A/B/C Nano Multi Layer |
| 8 | TiAlN(5:5)/AlTiCrN(54:38:8)/AlTiSiN(58:37:5) | 30 | 3.5 | Quaternary A/B/C Nano Multi-Layer |
| 9 | TiAlN(5:5)/AlTiCrN(54:38:8)/NbN | 30 | 3.4 | Quaternary A/B/C Nano Multi-Layer |
| 10 | TiAlN(5:5)/AlTiCrN(4:3:3)/VN | 29 | 3.4 | Quaternary A/B/C Nano Multi-Layer |
| 11 | AlTiN(7:3)/AlTiCrN(4:3:3)/NbN | 28 | 3.6 | Quaternary A/B/C Nano Multi-Layer |
| 12 | AlTiN(7:3)/AlTiCrN(4:3:3)/VN | 29 | 3.3 | Quaternary A/B/C Nano Multi-Layer |
| 13 | TiAlN(5:5)/AlTiCrN(54:38:8)/NbN/AlTiN(67:33) | 31 | 3.5 | Quaternary A/B/C Nano Multi-Layer |
| 14 | TiAlN(5:5)/AlTiCrN(54:38:8)/VN/AlTiN(67:33) | 32 | 3.6 | Quaternary A/B/C Nano Multi-Layer |
| 15 | TiAlN(5:5)/AlCrN(7:3)/TiN/AlTiSiN(58:37:5) | 33 | 3.8 | Quaternary A/B/C Nano Multi-Layer |

As confirmed in Table 2, in Comparative Examples 1 to 4, a TiAlN film or an AlTiN film, an AlTiCrN film and a TiN film were sequentially stacked in an A/B/C stack structure at an average thickness of 30 nm to 31 nm to form hard films each having a total thickness of 3.4 μm to 3.6 μm, in Comparative Examples 5 to 8, a TiAlN film or an AlTiN film, an AlCrN film or an AlTiCrN film and an AlTiSiN film were sequentially stacked in an A/B/C stack structure at an average thickness of 30 nm to 31 nm to form hard films each having a total thickness of 3.5 μm to 3.8 μm, and in Comparative Examples 9 to 12, a TiAlN film or an AlTiN film, an AlTiCrN film and an NbN film or a VN film were sequentially stacked in an A/B/C stack structure at an average thickness of 28 nm to 30 nm to form hard films each having a total thickness of 3.3 μm to 3.6 μm, and, these hard films are to confirm a cutting performance difference according to a nano multi layer composition (where some thin films are excepted or the hard films are formed of thin films having a general composition, such as a TiN film or an AlCrN film) difference and a stack structure difference from hard films for a cutting tool according to Examples of the present invention.

Also, in Comparative Examples 13 to 15, a TiAlN film, an AlTiCrN film or an AlCrN film, an NbN film, a VN film or a TiN film, and an AlTiN film or an AlTiSiN film were sequentially stacked in an A/B/C/D stack structure at an average thickness of 31 nm to 33 nm to form hard films each having a total thickness of 3.5 μm to 3.8 μm, and, theses hard films are to confirm a cutting performance difference according to a nano multi layer composition (where some thin films are formed of a different general composition) difference from hard films for a cutting tool according to Examples of the present invention.

The following Tables 3 and 4 show measurement results of real compositions of thin films constituting each layer measured by using an energy dispersive X-ray spectrometer (EDX) after hard films for a cutting tool according to Examples of the present invention and Comparative Examples were formed.

TABLE 3

| Example No. | Nano Multi-layered Structure (Target Composition Ratio) | Thin Film Composition (EDX, at %) | | | | | | |
|---|---|---|---|---|---|---|---|---|
| | | Al | Ti | Cr | Nb | V | Si | N |
| 1 | TiAlN(5:5)/AlTiCrN(54:38:8)/NbN/AlTiSiN(58:37:5) | 23.9 | 18.4 | 1.2 | | 14.8 | 0.7 | 41 |
| 2 | TiAlN(5:5)/AlTiCrN(54:38:8)/VN/AlTiSiN(58:37:5) | 22.1 | 17.1 | 1.1 | | 13.7 | 0.7 | 45.4 |
| 3 | TiAlN(5:5)/AlTiCrN(4:3:3)/NbN/AlTiSiN(58:37:5) | 20.1 | 15.9 | 4.1 | 13.6 | | 0.7 | 45. |
| 4 | TiAlN(5:5)/AlTiCrN(4:3:3)/VN/AlTiSiN(58:37:5) | 20.2 | 16 | 4.1 | | 13.7 | 0.7 | 45.4 |
| 5 | AlTiN(7:3)/AlTiCrN(54:38:8)/NbN/AlTiSiN(58:37:5) | 24.2 | 14 | 1.1 | 13.3 | | 0.7 | 46.8 |
| 6 | AlTiN(7:3)/AlTiCrN(54:38:8)/VN/AlTiSiN(58:37:5) | 24.9 | 14.4 | 1.1 | | 13.7 | 0.7 | 45.2 |
| 7 | AlTiN(7:3)/AlTiCrN(4:3:3)/NbN/AlTiSiN(58:37:5) | 23.1 | 13.3 | 4.1 | 13.8 | | 0.7 | 45 |

TABLE 3-continued

| Example No. | Nano Multi-layered Structure (Target Composition Ratio) | Thin Film Composition (EDX, at %) | | | | | | |
|---|---|---|---|---|---|---|---|---|
| | | Al | Ti | Cr | Nb | V | Si | N |
| 8 | AlTiN(7:3)/AlTiCrN(4:3:3)/VN/AlTiSiN(58:37:5) | 23.5 | 13.6 | 4.2 | | 14 | 0.7 | 44.1 |

TABLE 4

| Comparative Example No. | Nano Multi-layered Structure (Target Composition Ratio) | Thin Film Composition (EDX, at %) | | | | | | |
|---|---|---|---|---|---|---|---|---|
| | | Al | Ti | Cr | Nb | V | Si | N |
| 1 | TiAlN(5:5)/AlTiCrN(54:38:8)/TiN | 19.4 | 35.1 | 1.5 | | | | 44 |
| 2 | TiAlN(5:5)/AlTiCrN(4:3:3)/TiN | 16.8 | 33.6 | 5.6 | | | | 44 |
| 3 | AlTiN(7:3)/AlTiCrN(54:38:8)/TiN | 22.7 | 30.8 | 1.5 | | | | 45 |
| 4 | AlTiN(7:3)/AlTiCrN(4:3:3)/TiN | 20 | 29.1 | 5.5 | | | | 45.5 |
| 5 | AlTiN(7:3)/AlCrN(7:3)/AlTiSiN(58:37:5) | 36.3 | 12.3 | 5.5 | | | 0.9 | 45 |
| 6 | TiAlN(5:5)/AlCrN(7:3)/AlTiSiN(58:37:5) | 33.2 | 16.2 | 5.6 | | | 0.9 | 44 |
| 7 | AlTiN(7:3)/AlTiCrN(54:38:8)/AlTiSiN(58:37:5) | 34.5 | 19.9 | 1.5 | | | 0.9 | 43.2 |
| 8 | TiAlN(5:5)/AlTiCrN(54:38:8)/AlTiSiN(58:37:5) | 29.1 | 22.5 | 1.4 | | | 0.9 | 46.1 |
| 9 | TiAlN(5:5)/AlTiCrN(54:38:8)/NbN | 18.4 | 15.5 | 1.4 | 17.7 | | | 47 |
| 10 | TiAlN(5:5)/AlTiCrN(4:3:3)/VN | 15.8 | 14.1 | 5.3 | | 17.6 | | 47.2 |
| 11 | AlTiN(7:3)/AlTiCrN(4:3:3)/NbN | 20.2 | 11 | 5.5 | 18.3 | | | 45 |
| 12 | AlTiN(7:3)/AlTiCrN(4:3:3)/VN | 20 | 10.9 | 5.5 | | 18.2 | | 45.4 |
| 13 | TiAlN(5:5)/AlTiCrN(54:38:8)/NbN/AlTiN(67:33) | 24.3 | 17.2 | 1.1 | 14.2 | | | 43.2 |
| 14 | TiAlN(5:5)/AlTiCrN(54:38:8)/VN/AlTiN(67:33) | 24.8 | 17.5 | 1.2 | | 14.5 | | 42 |
| 15 | TiAlN(5:5)/AlCrN(7:3)/TiN/AlTiSiN(58:37:5) | 25.1 | 26.4 | 4.2 | | | 0.7 | 43.5 |

As confirmed in Table 3 described above, the formed hard films for a cutting tool have real compositions that are somewhat different from target compositions, but almost similar to the target compositions.

Evaluation of Room Temperature Hardness, Degradation Hardness, Friction Coefficient and Crack Length In order to compare and evaluate Examples 1 to 8 of the present invention and Comparative Examples 1 to 15 formed as described above, a microhardness test was performed using a Fisher scope (model name "HP100C-XYP"; Germany HELMUT FISCHER GMBH, ISO14577), and room temperature hardness directly after forming hard films and degradation hardness after a high temperature degradation treatment at a temperature of 900° C. for 30 minutes were measured, respectively.

Such a microhardness test was performed under conditions of a load of 30 mN, an unload of 30 mN, a load time of 10 sec., and a creep time of 5 sec.

Also, in order to evaluate a friction characteristic of the hard films, a sliding distance (60 revolutions of a ball (where a material is $SiN_4$, a diameter is 4 mm, and hardness is HV50g1600)) was measured through a ball-on-disc test by using a CETR UMT-2 micro-tribometer. At this time, the friction characteristic evaluation was performed under conditions of a temperature of 20° C. to 25° C., a relative humidity of 50% to 60%, and a rotation speed of 318 rpm (10 m/min).

Also, in order to evaluate toughness (crack resistance) of the hard films, a length of a crack generated on the hard film was measured by applying a diamond pressure mark having a load of 30 kgf.

Measurement results of room temperature hardness, degradation hardness, a friction coefficient and a crack length obtained with respect to Examples 1 to 8 of the present invention and Comparative Examples 1 to 15 are shown in Tables 5 and 6, respectively.

TABLE 5

| Example No. | Nano Multi-layered Structure (Target Composition Ratio) | Room Temperature Hardness (GPa) | Degradation Hardness GPa) | Friction Coefficient (COF) | Crack Length (µm) |
|---|---|---|---|---|---|
| 1 | TiAlN(5:5)/AlTiCrN(54:38:8)/NbN/AlTiSiN(58:37:5) | 38 | 36.2 | 0.4 | 42 |
| 2 | TiAlN(5:5)/AlTiCrN(54:38:8)/VN/AlTiSiN(58:37:5) | 37.2 | 36 | 0.42 | 43 |
| 3 | TiAlN(5:5)/AlTiCrN(4:3:3)/NbN/AlTiSiN(58:37:5) | 36.9 | 35.9 | 0.35 | 41 |
| 4 | TiAlN(5:5)/AlTiCrN(4:3:3)/VN/AlTiSiN(58:37:5) | 37 | 35.5 | 0.38 | 44 |
| 5 | AlTiN(7:3)/AlTiCrN(54:38:8)/NbN/AlTiSiN(58:37:5) | 38.5 | 36.7 | 0.41 | 45 |
| 6 | AlTiN(7:3)/AlTiCrN(54:38:8)/VN/AlTiSiN(58:37:5) | 38.4 | 36.9 | 0.42 | 45 |
| 7 | AlTiN(7:3)/AlTiCrN(4:3:3)/NbN/AlTiSiN(58:37:5) | 38.1 | 37.1 | 0.39 | 41 |
| 8 | AlTiN(7:3)/AlTiCrN(4:3:3)/VN/AlTiSiN(58:37:5) | 37.9 | 36.5 | 0.39 | 42 |

TABLE 6

| Comparative Example No. | Nano Multi-layered Structure (Target Composition Ratio) | Room Temperature Hardness (GPa) | Degradation Hardness GPa) | Friction Coefficient (COF) | Crack Length (µm) |
|---|---|---|---|---|---|
| 1 | TiAlN(5:5)/AlTiCrN(54:38:8)/TiN | 34 | 28 | 0.6 | 43 |
| 2 | TiAlN(5:5)/AlTiCrN(4:3:3)/TiN | 33.5 | 27 | 0.42 | 49 |
| 3 | AlTiN(7:3)/AlTiCrN(54:38:8)/TiN | 35.8 | 28.4 | 0.58 | 44 |
| 4 | AlTiN(7:3)/AlTiCrN(4:3:3)/TiN | 34.2 | 26.8 | 0.48 | 45 |
| 5 | AlTiN(7:3)/AlCrN(7:3)/AlTiSiN(58:37:5) | 36.8 | 34.5 | 0.5 | 47 |
| 6 | TiAlN(5:5)/AlCrN(7:3)/AlTiSiN(58:37:5) | 36.4 | 34.1 | 0.54 | 44 |
| 7 | AlTiN(7:3)/AlTiCrN(54:38:8)/AlTiSiN(58:37:5) | 36.5 | 34.4 | 0.56 | 42 |
| 8 | TiAlN(5:5)/AlTiCrN(54:38:8)/AlTiSiN(58:37:5) | 35.9 | 34.1 | 0.59 | 42 |
| 9 | TiAlN(5:5)/AlTiCrN(54:38:8)/NbN | 35.8 | 30.1 | 0.45 | 52 |
| 10 | TiAlN(5:5)/AlTiCrN(4:3:3)/VN | 35 | 31.5 | 0.4 | 49 |
| 11 | AlTiN(7:3)/AlTiCrN(4:3:3)/NbN | 34.9 | 30 | 0.42 | 48 |
| 12 | AlTiN(7:3)/AlTiCrN(4:3:3)/VN | 35.1 | 30.3 | 0.39 | 44 |
| 13 | TiAlN(5:5)/AlTiCrN(54:38:8)/NbN/AlTiN(67:33) | 37.5 | 32.5 | 0.54 | 50 |
| 14 | TiAlN(5:5)/AlTiCrN(54:38:8)/VN/AlTiN(67:33) | 38 | 32 | 0.56 | 49 |
| 15 | TiAlN(5:5)/AlCrN(7:3)/TiN/AlTiSiN(58:37:5) | 37.4 | 31.8 | 0.53 | 51 |

As confirmed in Tables 5 and 6, in comparison between hard films of Comparative Examples 1 to 12 and hard films for a cutting tool according to Examples of the present invention, the hard films of the comparative examples except for some of thin films having nano multi-layered compositions or formed of a general composition such as a TiN film or an AlCrN film and having a stack structure of an A/B/C, have room temperature hardness of 33.5 GPa to 36.8 GPa which is low compared to room temperature hardness of 36.9 GPa to 38.5 GPa of Examples to 8 of the present invention, and especially, have degradation hardness of 26.8 GPa to 34.5 GPa which is very low compared to degradation hardness of 35.5 GPa to 37.1 GPa of Examples 1 to 8 of the present invention, and therefore, it may be confirmed that hardness is remarkably reduced under a high temperature degradation environment.

Also, it may be confirmed that most of Comparative Examples 1 to 12 have a friction coefficient of 0.4 to 0.6 except for a friction coefficient of 0.39 of Comparative Example 12, which is high compared to a friction coefficient of 0.35 to 0.42 of Examples 1 to 8 of the present invention.

Furthermore, Comparative Examples 1 to 12 have a crack length of 42 µm to 52 µm, whereas Examples 1 to 8 of the present invention have a crack length of 41 µm to 45 µm all of which are short within 45 µm, and therefore, it has been confirmed that the hard films for a cutting tool according to Examples of the present invention are excellent in toughness.

Meanwhile, in comparison between hard films of Comparative Examples 13 to 15 and hard films for a cutting tool according to Examples of the present invention, the hard films of Comparative Examples 13 to 15 have the same stack structure of an A/B/C/D as the hard films of Examples of the present invention, but it has been confirmed that the hard films in which some of thin films having the nano multi-layered compositions are formed of a general composition such as a TiN film or an AlCrN film, have room temperature hardness of 37.4 GPa to GPa which is somewhat similar to room temperature hardness of 36.9 GPa to 38.5 GPa of Examples 1 to 8 of the present invention, but have degradation hardness of 31.8 GPa to 32.5 GPa which is still considerably low compared to degradation hardness of 35.5 GPa to 37.1 GPa of Examples 1 to 8 of the present invention.

Also, Comparative Examples 13 and 15 have a friction coefficient of 0.52 to 0.56 which is very high compared to a friction coefficient of 0.35 to 0.42 of Examples 1 to 8 of the present invention, and thus it has been shown that lubricant thereof is very low compared to Examples 1 to 8 of the present invention.

Furthermore, Comparative Examples 13 and 15 have a crack length of 49 μm to 51 μm which is very long compared to a crack length of 41 μm to 45 μm of Examples 1 to 8 of the present invention, and thus it has been confirmed that the hard films for a cutting tool according to Examples of the present invention are very excellent in toughness.

It may be seen that the hard films of Examples 1 to of the present invention has toughness, lubricant (a friction coefficient) and toughness (crack resistance) evenly improved compared to the hard films of Comparative Examples 1 to 15 from evaluations with respect to physical properties of the hard films described above.

Evaluation of Abrasion Resistance

In order to evaluate cutting performance when the hard films of Examples 1 to 8 of the present invention and Comparative Examples 1 to 15 are used in a cutting requiring especially abrasion resistance, a milling cutting test was performed under conditions of a workpiece: alloy steel (SCM440, a milling), Sample Type No. SPKN1504EDSR (ISO), cutting speed: 200 m/min, cutting feed rate: 0.2 mm/tooth, and cutting depth: 2 mm, and results are respectively shown in the following Tables 7 and 8

TABLE 7

| Example No. | Nano Multi-layered Structure (Target Composition Ratio) | Cutting Life cycle (cutting length. M) | Life cycle End Factor |
| --- | --- | --- | --- |
| 1 | TiAlN(5:5)/AlTiCrN(54:38:8)/NbN/AlTiSiN(58:37:5) | 18 | normal abrasion |
| 2 | TiAlN(5:5)/AlTiCrN(54:38:8)/VN/AlTiSiN(58:37:5) | 17.5 | normal abrasion |
| 3 | TiAlN(5:5)/AlTiCrN(4:3:3)/NbN/AlTiSiN(58:37:5) | 17.5 | normal abrasion |
| 4 | TiAlN(5:5)/AlTiCrN(4:3:3)/VN/AlTiSiN(58:37:5) | 17.8 | normal abrasion |
| 5 | AlTiN(7:3)/AlTiCrN(54:38:8)/NbN/AlTiSiN(58:37:5) | 18.2 | normal abrasion |
| 6 | AlTiN(7:3)/AlTiCrN(54:38:8)/VN/AlTiSiN(58:37:5) | 18.5 | normal abrasion |
| 7 | AlTiN(7:3)/AlTiCrN(4:3:3)/NbN/AlTiSiN(58:37:5) | 17.5 | normal abrasion |
| 8 | AlTiN(7:3)/AlTiCrN(4:3:3)/VN/AlTiSiN(58:37:5) | 17.5 | normal abrasion |

TABLE 8

| Comparative Example No. | Nano Multi-layered Structure (Target Composition Ratio) | Cutting Life cycle (cutting length. M) | Life cycle End Factor |
| --- | --- | --- | --- |
| 1 | TiAlN(5:5)/AlTiCrN(54:38:8)/TiN | 9 | Chipping |
| 2 | TiAlN(5:5)/AlTiCrN(4:3:3)/TiN | 9.5 | excessive abrasion |
| 3 | AlTiN(7:3)/AlTiCrN(54:38:8)/TiN | 11 | excessive abrasion |
| 4 | AlTiN(7:3)/AlTiCrN(4:3:3)/TiN | 11 | excessive abrasion |
| 5 | AlTiN(7:3)/AlCrN(7:3)/AlTiSiN(58:37:5) | 12 | chipping |
| 6 | TiAlN(5:5)/AlCrN(7:3)/AlTiSiN(58:37:5) | 12.5 | chipping |
| 7 | AlTiN(7:3)/AlTiCrN(54:38:8)/AlTiSiN(58:37:5) | 13 | normal abrasion |
| 8 | TiAlN(5:5)/AlTiCrN(54:38:8)/AlTiSiN(58:37:5) | 12.5 | normal abrasion |
| 9 | TiAlN(5:5)/AlTiCrN(54:38:8)/NbN | 12 | excessive abrasion |
| 10 | TiAlN(5:5)/AlTiCrN(4:3:3)/VN | 11.5 | excessive abrasion |
| 11 | AlTiN(7:3)/AlTiCrN(4:3:3)/NbN | 11 | excessive abrasion |
| 12 | AlTiN(7:3)/AlTiCrN(4:3:3)/VN | 12 | excessive abrasion |
| 13 | TiAlN(5:5)/AlTiCrN(54:38:8)/NbN/AlTiN(67:33) | 15 | normal abrasion |
| 14 | TiAlN(5:5)/AlTiCrN(54:38:8)/VN/AlTiN(67:33) | 16.2 | normal abrasion |
| 15 | TiAlN(5:5)/AlCrN(7:3)/TiN/AlTiSiN(58:37:5) | 16 | normal abrasion |

As confirmed in Tables 7 and 8, Examples 1 to 8 of the present invention have cutting life of 17.5 m to 18.5 m of which all is 17.5 m or more, and a life cycle end factor corresponding to normal abrasion, however, it may be confirmed that in comparison between the hard films of Comparative Examples 1 to 12 and the hard films for a cutting tool according to Examples of the present invention, the hard films of Comparative Example except for some of thin films having nano multi-layered compositions or formed of a general composition such as a TiN film or an AlCrN film and having a stack structure of an A/B/C, have not ended their life cycle through normal abrasion but have ended the life cycle through chipping or excessive abrasion except for Comparative Examples 7 and 8, and have a cutting life cycle of only 9 m to 13 m even when Comparative Examples 7 and 8 are included. Thus, it may be confirmed that the abrasion resistance of Comparative Examples is remarkably low.

Also, it has been shown that Comparative Examples 13 to 15 having the similar stack structure of an A/B/C/D to Examples of the present invention but some of which thin films having the nano multi-layered compositions is formed of a general composition such as a TiN film or an AlCrN film, have ended their life cycle through normal abrasion, but have cutting life time of 15 m to 16.2 m which is low compared to the life cycle of 17.5 m to 18.5 m of Examples 1 to 8 of the present invention.

Therefore, it is confirmed that the hard films of Examples 1 to 8 of the present invention have an excellent abrasion resistance characteristic.

Evaluation of Toughness (Impact Resistance)

In order to evaluate cutting performance when hard films of Examples 1 to 8 of the present invention and Comparative Examples 1 to 15 are used in a cutting condition requiring especially, toughness (impact resistance), milling processing impact resistance cutting performance evaluation (interrupted evaluation) was performed under conditions of a workpiece: alloy steel (SCM440, alloy steel 3 line diaphragm milling processing), Sample Type No. SPKN1504EDSR (ISO), cutting speed: 200 m/min, cutting feed rate: 0.2 mm/tooth, and cutting depth: 2 mm, the evaluation was performed until a fracture of an insert coated with a hard film, and the results are shown in the following Tables 9 and 10.

TABLE 9

| Example No. | Nano Multi-layered Structure (Target Composition Ratio) | Cutting Life cycle (cutting length. M) |
|---|---|---|
| 1 | TiAlN(5:5)/AlTiCrN(54:38:8)/NbN/AlTiSiN(58:37:5) | 13 |
| 2 | TiAlN(5:5)/AlTiCrN(54:38:8)/VN/AlTiSiN(58:37:5) | 10.5 |
| 3 | TiAlN(5:5)/AlTiCrN(4:3:3)/NbN/AlTiSiN(58:37:5) | 11 |
| 4 | TiAlN(5:5)/AlTiCrN(4:3:3)/VN/AlTiSiN(58:37:5) | 11.2 |
| 5 | AlTiN(7:3)/AlTiCrN(54:38:8)/NbN/AlTiSiN(58:37:5) | 10.7 |
| 6 | AlTiN(7:3)/AlTiCrN(54:38:8)/VN/AlTiSiN(58:37:5) | 10.5 |
| 7 | AlTiN(7:3)/AlTiCrN(4:3:3)/NbN/AlTiSiN(58:37:5) | 11.5 |
| 8 | AlTiN(7:3)/AlTiCrN(4:3:3)/VN/AlTiSiN(58:37:5) | 12 |

TABLE 9

| Comparative Example No. | Nano Multi-layered Structure (Target Composition Ratio) | Cutting Life cycle (cutting length. M) |
|---|---|---|
| 1 | TiAlN(5:5)/AlTiCrN(54:38:8)/TiN | 8 |
| 2 | TiAlN(5:5)/AlTiCrN(4:3:3)/TiN | 8.5 |
| 3 | AlTiN(7:3)/AlTiCrN(54:38:8)/TiN | 8.5 |
| 4 | AlTiN(7:3)/AlTiCrN(4:3:3)/TiN | 8.5 |
| 5 | AlTiN(7:3)/AlCrN(7:3)/AlTiSiN(58:37:5) | 9 |
| 6 | TiAlN(5:5)/AlCrN(7:3)/AlTiSiN(58:37:5) | 9.5 |
| 7 | AlTiN(7:3)/AlTiCrN(54:38:8)/AlTiSiN(58:37:5) | 8 |
| 8 | TiAlN(5:5)/AlTiCrN(54:38:8)/AlTiSiN(58:37:5) | 8.5 |
| 9 | TiAlN(5:5)/AlTiCrN(54:38:8)/NbN | 10 |
| 10 | TiAlN(5:5)/AlTiCrN(4:3:3)/VN | 10.5 |
| 11 | AlTiN(7:3)/AlTiCrN(4:3:3)/NbN | 11 |
| 12 | AlTiN(7:3)/AlTiCrN(4:3:3)/VN | 10.5 |
| 13 | TiAlN(5:5)/AlTiCrN(54:38:8)/NbN/AlTiN(67:33) | 9 |
| 14 | TiAlN(5:5)/AlTiCrN(54:38:8)/VN/AlTiN(67:33) | 10 |
| 15 | TiAlN(5:5)/AlCrN(7:3)/TiN/AlTiSiN(58:37:5) | 9 |

As confirmed in Table 9 and 10, Examples 1 to 8 of the present invention have a cutting life cycle of 10.5 m to 13 m, of which all is 10.5 m or more and is even 13 m, however, Comparative Examples 1 to 15 have a cutting life cycle of 8 m to 10.5 m, of which all is 10.5 m or less. Thus, the hard films according to Examples of the present invention show excellent impact resistant.

Evaluation of Comprehensive Cutting Performance

Generally, since a drilling has a cutting speed which is slow compared to a milling, and is performed under a wet condition, lubricant (seizure resistance) and chipping resistance are very important. In order to comprehensively evaluate lubricant, chipping resistance, abrasion resistance and toughness according to hard films of Examples 1 to 8 of the present invention and Comparative Examples 1 to 15, a drilling performance cutting evaluation was performed under conditions of a workpiece: carbon steel (SCM440, a carbon steel drilling), a Sample Type No. SPMT07T208/XOMT07T205 9504EDSR (indexable drill insert, 20Φ-5D), a cutting speed: 200 m/min, a cutting feed rate: 0.1 mm/tooth, and a cutting depth: 90 mm ((penetration), and the results is shown the following Tables 11 and 12.

TABLE 11

| Example No. | Nano Multi-layered Structure (Target Composition Ratio) | Cutting Life cycle (hole: 20Φ-90 mm) | Life cycle End Factor |
|---|---|---|---|
| 1 | TiAlN(5:5)/AlTiCrN(54:38:8)/NbN/AlTiSiN(58:37:5) | 256 | normal abrasion |
| 2 | TiAlN(5:5)/AlTiCrN(54:38:8)/VN/AlTiSiN(58:37:5) | 256 | normal abrasion |
| 3 | TiAlN(5:5)/AlTiCrN(4:3:3)/NbN/AlTiSiN(58:37:5) | 256 | normal abrasion |
| 4 | TiAlN(5:5)/AlTiCrN(4:3:3)/VN/AlTiSiN(58:37:5) | 256 | normal abrasion |
| 5 | AlTiN(7:3)/AlTiCrN(54:38:8)/NbN/AlTiSiN(58:37:5) | 256 | normal abrasion |
| 6 | AlTiN(7:3)/AlTiCrN(54:38:8)/VN/AlTiSiN(58:37:5) | 256 | normal abrasion |
| 7 | AlTiN(7:3)/AlTiCrN(4:3:3)/NbN/AlTiSiN(58:37:5) | 256 | normal abrasion |
| 8 | AlTiN(7:3)/AlTiCrN(4:3:3)/VN/AlTiSiN(58:37:5) | 256 | normal abrasion |

TABLE 12

| Comparative Example No. | Nano Multi-layered Structure (Target Composition Ratio) | Cutting Life cycle (hole: 20Φ-90 mm) | Life cycle End Factor |
|---|---|---|---|
| 1 | TiAlN(5:5)/AlTiCrN(54:38:8)/TiN | 52 | seizure/chipping |
| 2 | TiAlN(5:5)/AlTiCrN(4:3:3)/TiN | 52 | excessive abrasion |
| 3 | AlTiN(7:3)/AlTiCrN(54:38:8)/TiN | 104 | seizure/chipping |
| 4 | AlTiN(7:3)/AlTiCrN(4:3:3)/TiN | 52 | excessive abrasion |
| 5 | AlTiN(7:3)/AlCrN(7:3)/AlTiSiN(58:37:5) | 156 | chipping |
| 6 | TiAlN(5:5)/AlCrN(7:3)/AlTiSiN(58:37:5) | 208 | chipping |
| 7 | AlTiN(7:3)/AlTiCrN(54:38:8)/AlTiSiN(58:37:5) | 208 | chipping |
| 8 | TiAlN(5:5)/AlTiCrN(54:38:8)/AlTiSiN(58:37:5) | 208 | chipping |
| 9 | TiAlN(5:5)/AlTiCrN(54:38:8)/NbN | 232 | excessive abrasion |
| 10 | TiAlN(5:5)/AlTiCrN(4:3:3)/VN | 156 | excessive abrasion |
| 11 | AlTiN(7:3)/AlTiCrN(4:3:3)/NbN | 156 | excessive abrasion |
| 12 | AlTiN(7:3)/AlTiCrN(4:3:3)/VN | 156 | excessive abrasion |
| 13 | TiAlN(5:5)/AlTiCrN(54:38:8)/NbN/AlTiN(67:33) | 232 | excessive abrasion |
| 14 | TiAlN(5:5)/AlTiCrN(54:38:8)/VN/AlTiN(67:33) | 256 | normal abrasion |
| 15 | TiAlN(5:5)/AlCrN(7:3)/TiN/AlTiSiN(58:37:5) | 232 | excessive abrasion |

From the results of Tables 11 and 12, it is shown that the cutting tools on which the hard films of Examples 1 to 8 of the present invention are formed, have a life cycle which is considerably high compared to Comparative Examples 1 to 15. Especially, it is shown that all of Comparative Example 1 to 15 except for Comparative Example 14 have ended their life cycle through seizure/chipping or excessive abrasion. Thus, in a comprehensive cutting performance evaluation, the hard films of Examples 1 to 8 of the present invention show very excellent performance.

It has been confirmed that a nano multi-layered structure formed by sequentially stacking a Ti and Al composite nitride layer having excellent abrasion resistance, an Al, Ti and Cr composite nitride layer having excellent lubricant, an Nb or V composite nitride layer having excellent toughness and chipping resistance and an Al, Ti and Si composite nitride layer having excellent oxidation resistance may evenly improve various characteristics required for a hard film for a cutting tool, such as abrasion resistance, lubricant, toughness, chipping resistance, and oxidation resistance to be suitably used in a cutting tool for a difficult-to-cut material.

While only detailed Examples of the present invention has been particularly shown and described, it will be apparent to those skilled in the art that the detailed description may be amended or modified without departing from the spirit and scope of the present invention, and it will be reasonable that all modifications and amendments belong to the following claims.

The invention claimed is:

1. A hard film for a cutting tool formed on a surface of a base material, the hard film being comprised of a nano multi-layered structure comprising a thin layer A, a thin layer B, a thin layer C and a thin layer D or a structure in which the nano multi-layered structure is repeatedly stacked at least twice,
wherein the thin layer A is comprised of Ti1-xAlxN ($0.5 \leq x \leq 0.7$); the thin layer B is comprised of Al1-y-z TiyCrzN ($0.3 \leq y \leq 0.6$ and $0 < z \leq 0.3$); the thin layer B is comprised of MeN (where Me is Nb or V); and the thin layer D is comprised of Al1-a-bTiaSibN ($0.3 \leq a \leq 0.7$ and $0 < b < 0.1$).

2. The hard film of claim 1, wherein the nano multi-layered structure is formed by sequentially stacking the thin layer A, the thin layer B, the thin layer C and the thin layer D on the base material.

3. The hard film of claim 1, wherein each of the thin layer A, the thin layer B, the thin layer C and the thin layer D has an average thickness of 3 nm to 50 nm.

4. The hard film of claim 1, wherein each of the thin layer A, the thin layer B, the thin layer C and the thin layer D has an average thickness of 20 nm to 40 nm.

5. The hard film of claim 1, wherein the hard film has an average thickness of 1 μm to 20 μm.

6. The hard film of claim 1, wherein the hard film has a degradation hardness not less than 35 GPa when degradation-treated at a temperature of 900° C. for 30 minutes.

7. The hard film of claim 2, wherein each of the thin layer A, the thin layer B, the thin layer C and the thin layer D has an average thickness of 3 nm to 50 nm.

8. The hard film of claim 2, wherein each of the thin layer A, the thin layer B, the thin layer C and the thin layer D has an average thickness of 20 nm to 40 nm.

9. The hard film of claim 2, wherein the hard film has an average thickness of 1 μm to 20 μm.

10. The hard film of claim 2, wherein the hard film has a degradation hardness not less than 35 GPa when degradation-treated at a temperature of 900° C. for 30 minutes.

* * * * *